US012772835B2

(12) United States Patent
Feng et al.

(10) Patent No.: US 12,772,835 B2
(45) Date of Patent: Oct. 20, 2026

(54) IC PACKAGE WITH NANOTWINNING-ASSISTED STRUCTURALLY STABLE COPPER STRUCTURE

(71) Applicant: City University of Hong Kong, Hong Kong (HK)

(72) Inventors: Shien-Ping Feng, Hong Kong (HK); Chih-Chun Chung, Hong Kong (HK); Sheng-Jye Cherng, Hong Kong (HK); Kaiyu Mu, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 326 days.

(21) Appl. No.: 18/435,979

(22) Filed: Feb. 7, 2024

(65) Prior Publication Data

US 2024/0321749 A1 Sep. 26, 2024

Related U.S. Application Data

(60) Provisional application No. 63/491,528, filed on Mar. 21, 2023.

(51) Int. Cl.

| | |
|---|---|
| ***H10W 20/44*** | (2026.01) |
| ***H10W 20/00*** | (2026.01) |
| ***H10W 20/43*** | (2026.01) |
| ***H10W 74/01*** | (2026.01) |
| ***H10W 74/10*** | (2026.01) |

(52) U.S. Cl.

CPC ..... *H10W 20/4421* (2026.01); *H10W 20/056* (2026.01); *H10W 20/081* (2026.01); *H10W 20/43* (2026.01); *H10W 74/01* (2026.01)

(58) Field of Classification Search

CPC ............. H10W 20/081; H10W 20/033; H10W 20/083; H10W 20/40; H10W 20/0698; H10W 20/056; H10W 20/43; H10W 20/4421; H10W 70/60; H10W 70/62; H10W 70/65; H10W 70/652; H10W 70/6523; H10W 70/654; H10W 70/655; H10W 70/656; H10W 70/6565; H10W 70/657; H10W 74/01; H10W 74/117

See application file for complete search history.

(56) References Cited

U.S. PATENT DOCUMENTS

2012/0024713 A1* 2/2012 Preisser .................. C25D 3/38 205/123
2018/0332717 A1* 11/2018 Zhou ...................... H05K 3/421
(Continued)

OTHER PUBLICATIONS

I-Hsin Tseng et al., "High Electromigration Lifetimes of Nanotwinned Cu Redistribution Lines," IEEE, 2019, p. 1328-1333.
(Continued)

*Primary Examiner* — Sonya McCall-Shepard

(74) *Attorney, Agent, or Firm* — IDEA Intellectual Limited; Sam T. Yip

(57) ABSTRACT

The present invention introduces a composite copper (Cu) structure that combines fine grains and nanotwins, providing structural stability and effective resistance to surface damage even after extended periods. This offers a promising solution for achieving finer Redistribution Layer (RDL) in advanced packaging technologies, with a longer electromigration lifetime compared to regular coarse-grain lines.

17 Claims, 18 Drawing Sheets

(56) References Cited

U.S. PATENT DOCUMENTS

2022/0384259 A1* 12/2022 Cheng ................ H10W 20/056
2023/0212773 A1* 7/2023 Oberst .................... C25D 5/02
205/123

OTHER PUBLICATIONS

Y. Zhao et al., "The effect of nanotwins on the corrosion behavior of copper," Acta Materialia, 2014, vol. 67, p. 181-188.
Tao-Chi Liu et al., "Eliminate Kirkendall voids in solder reactions on nanotwinned copper," Scripta Materialia, 2013, vol. 68, p. 241-244.
Kai-Cheng Shie et al., "A kinetic model of copper-to-copper direct bonding under thermal compression," J Mater Res Technol, 2021, vol. 15, p. 2332-2344.
I-Hsin Tseng et al., "Electromigration in 2μm redistribution lines and Cu—Cu bonds with highly <111> oriented nanotwinned Cu," 2020 IEEE 70th Electronic Components and Technology Conference (ECTC), 2020. p. 479-484.
Lei Qian et al., "Atomistic simulations of the enhanced creep resistance and underlying mechanisms of nanograined-nanotwinned copper," Materials Science and Engineering: A, 2022, vol. 855, p. 1-16.
Shaoxing Qu et al., "Atomistic mechanisms of microstructure evolution in nanotwinned polycrystals," Scripta Materialia, 2011, vol. 65, p. 265-268.
Tengfei Ma et al., "Dislocation transmission across Σ3{112} incoherent twin boundary: a combined atomistic and phase-field study," Acta Materialia, 2022, vol. 223 (117447), p. 1-13.
I-Hsin Tseng et al., "Effect of oxidation on electromigration in 2-μm Cu redistribution lines capped with polyimide," Results in Physics, 2021, vol. 31(105048), p. 1-6.
I-Hsin Tseng et al., "Electromigration failure mechanisms of <111> -oriented nanotwinned Cu redistribution lines with polyimide capping," Results in Physics, 2021, vol. 24 (104154), p. 1-6.
R. J. Miller et al., "Electromigration in Gold and Copper Thin Film Conductors," Thin Solid Films, 1980, vol. 69, p. 379-386.
Y. T. Hung et al., "Electromigration Improvement by Graphene on Cu Wire for Next Generation VLSI," 2021 International Conference on Electronics Packaging (ICEP), 2021, p. 103-104.
Dinh-Phuc Tran et al., "Enhancement of electromigration lifetime of copper lines by eliminating nanoscale grains in highly <111>-oriented nanotwinned structures," Journal of Materials Research and Technology, 2021, vol. 15, p. 6690-6699.
Tao-Chi Liu et al., "Fabrication and Characterization of (111)-Oriented and Nanotwinned Cu by Dc Electrodeposition," American Chemical Society, 2012, vol. 12, p. 5012-5016.
I-Hsin Tseng et al., "High Electromigration Resistance of Nanotwinned Cu Used in Redistribution Layers of Fan-out," 2020 15th International Microsystems, Packaging, Assembly and Circuits Technology Conference (IMPACT), 2020, p. 87-90.
A. V. Vairagar et al., "Improvement of Electromigration Lifetime of Submicrometer Dual-Damascene Cu Interconnects Through Surface Engineering," Journal of The Electrochemical Society, 2006, vol. 153 (9), p. G840-G845.
D. Bufford et al., "In situ nanoindentation study on plasticity and work hardening in aluminium with incoherent twin boundaries," Nature Communications, 2014, vol. 4 (4864), p. 1-9.
Mingqian Li et al., "Line Width and Capping Layer Effects on Electromigration Failure of Plasma Etched Copper Lines," ECS Transactions, 2019, vol. 92 (5), p. 9-16.
K. N. Tu et al., "Recent advances on electromigration in very-large-scale-integration of interconnects," Journal of Applied Physics, 2003, vol. 94 (9), p. 5451-5473.
C.-K. Hu et al., "Reduced electromigration of Cu wires by surface coating," Applied Physics Letters, 2002, vol. 81 (10), p. 1782-1784.
J.A. Brown et al., "Structure and motion of junctions between coherent and incoherent twin boundaries in copper," Acta Materialia, 2009, vol. 57, p. 4454-4462.
Zixiang SHI et al., "The serving behavior of nanotwinned copper under the reliability test of high temperature high humidity and electromigration test," 2022 23rd International Conference on Electronic Packaging Technology (ICEPT), 2002, p. 1-5.

* cited by examiner

IC PACKAGE WITH NANOTWINNING-ASSISTED STRUCTURALLY STABLE COPPER STRUCTURE

FIELD OF THE INVENTION

The present invention generally relates to a hybrid Cu structure. More specifically the present invention relates to a hybrid Cu structure for redistribution layer (RDL) circuits.

BACKGROUND OF THE INVENTION

Three-dimensional integrated circuits (3D ICs), which exploit the vertical dimension, extend scaling while providing a platform for heterogeneous integration and greater performance. In 3D IC technology, Through Silicon Via (TSV) plays a crucial role in achieving signal communication and power distribution between layers. Other than TSV, redistribution layer (RDL) is another critical component in the power delivery networks within heterogeneous 3-D systems. RDL is widely used in fan-out and 2.5D/3D packages, which is a layer of wiring copper interconnects that redistribute the I/O access to different parts of the chip and electrically connect one part of the semiconductor package to another.

Si-based devices are current-voltage (I-V) devices, so it requires electric charges to flow in and out of the circuitry. RDL carries a higher current, which is then redistributed to the chip. With increasing device density, the width and pitch of RDLs continue to shrink, and higher-end RDLs may even be as narrow as 2 μm line/space and even narrower. When the dimension is smaller than 10 μm. RDL may carry a higher current density exceeding $10^6$ A/cm$^2$. At such high current densities, atomic displacement is enhanced in the direction of electron flow due to momentum transfer between conducting electrons and diffusing metal atoms. This phenomenon leads to void formation at the cathode and extrusion at the anode. This phenomenon makes electromigration (EM) a critical issue that must be addressed in advanced RDL design. In addition to the electrical forces generated by the applied electric field, gradients in mechanical stress, chemical potential, and temperature also influence atomic diffusion in interconnects. Particularly, due to resistance in the conducting circuits, Joule heating occurs and effective heat dissipation becomes difficult especially in fine-pitch packaging devices. Considering a temperature difference of just 1° C. across a dimension of 10 μm, the resulting temperature gradient would be 1000° C./cm, demonstrating a significant impact on heat conduction. In a real device, the operating temperature at some points of the device can be as high as around 100° C. This temperature gradient causes thermal migration (TM) as well as thermal stress because different materials in the device have different coefficients of thermal expansion (CTE).

In face-centered-cubic metals such as Al and Cu, atomic diffusion is mediated by vacancies and can be classified as lattice diffusion, grain boundary diffusion, and surface diffusion. Here, the lattice diffusivity of Cu is insignificantly small ($7\times10^{-28}$ cm$^2$/s). Different from the EM damage of Al wire which is dominated by grain boundary diffusion, the surface diffusivity of Cu ($10^{-12}$ cm$^2$/s) is three orders of magnitude larger than the grain boundary diffusivity of Cu ($3\times10^{-15}\cdot$cm$^2$/s) under normal operating temperature. Therefore, EM in Cu occurs by surface diffusion which has a lower activation energy than grain boundary diffusion. Note that the difference between the surface and grain boundary diffusivities of Cu would become very small at high temperatures over 350° C.

Nanotwinned Cu is known to have high thermal stability, high electrical conductivity, and relatively lower CTE, which should be a good candidate for Cu RDL circuits. Recently, grain engineering approach has been focused on using (111) oriented nano twined Cu as the electrical circuit due to its high surface diffusivity and successfully eliminated bonding interfaces. Liu et al.[1] disclosed that (111) orientation-dominated nanotwinned copper is effective in eliminating Kirkendall voids compared to conventional randomly oriented coarse-grained copper. Chen et al.[2] reported that the diffusion rate of copper atoms could be significantly reduced by ten times when copper atoms pass through triple junctions of twin boundaries and grain boundaries. Tseng et al.[3] found that (111)-oriented nanotwinned Cu RDLs exhibited much higher electromigration resistance than regular Cu RDLs.

Despite the many advantages of nanotwinned copper, its usage in real manufacturing processes remains limited. The limited usage of nanotwinned copper in real manufacturing processes is due to the requirement for special additives in the electrolyte to guide the vertical growth of nanotwin structures on the sputtered Cu seed layer surface. However, such kind of vertical growth of copper structure cannot fulfil the requirement of via-filling. When filling a pattern with via holes, it is easy to form a void in the center due to the simultaneous growth of nanotwins in three different directions along the seed layer. It is the critical issue for advance 2.5D/3D IC packaging.

The following reference list sets forth the literatures mentioned in this section, which are incorporated herein by reference in their entirety:

1. Liu T C, Liu C M, Huang Y S, Chen C, Tu K N. Eliminate Kirkendall voids in solder reactions on nanotwinned copper. *Scripta Mater* 2013; 68:241-4.
2. Shie K C, Gusak A M, Tu K N, Chen C. A kinetic model of copper-to-copper direct bonding under thermal compression. *J Mater Res Technol* 2021; 15:2332-44.
3. Tseng I H, Shie K C, Tzu-Hung Lin B, Chang C C, Chen C. Electromigration in 2 μm redistribution lines and Cu—Cu bonds with highly-oriented nanotwinned Cu. In: Proceedings—electronic components and technology conference, 2020—June. Institute of Electrical and Electronics Engineers Inc.; 2020. p. 479-84.

SUMMARY OF THE INVENTION

As device density increases, RDL CD/pitch must shrink. During RDL circuit fabrication, the etching process is necessary to remove the exposed sputtered Cu seed layer and Ti barrier layer. Unfortunately, this process unavoidably etches and roughens the Cu surface of the RDL. As the post-plating resting time (q-time) increases, the Cu surface oxidizes, resulting in even worse surface roughness after etching. This roughness causes contact resistance and electromigration issues when the RDL linewidth shrinks. The present invention is aimed to overcome the limitations associated with the usage of nanotwinned copper in real manufacturing processes.

Accordingly, the present invention discloses a novel hybrid copper (Cu) structure designed for Redistribution Layer (RDL) layers, where a combination of fine grains and nanotwins coexists to enhance structural stability. The composite copper structure exhibits remarkable resistance to surface corrosion and minimizes surface damage, ensuring prolonged integrity even after extended post-plating resting periods (q-time). This innovation provides a viable solution for superior RDL in advanced packaging technologies.

In a first aspect, the present invention provides an IC package, including a substrate, a die on the surface of the substrate, a dielectric layer over the die, at least one RDL structure situated on the surface of the dielectric layer, and a plurality of conductive connectors electrically connected to the die through the at least one RDL structure, enabling electrical connections between the die and external components. The at least one RDL structure comprises a composite copper structure combining fine grains and nanotwinned copper, and at least one conductive feature (e.g., seed layer and Ti barrier layer).

The IC package may further include a second dielectric layer covering the first RDL structure to allow subsequent stacking of other RDL structures and additional layers.

The composite copper structure is formed by electroplating a electroplating copper solution comprising 0.4 M to 0.6 M of $CuSO_4 \cdot 5H_2O$, 70-100 g/L $H_2SO_4$, 30-50 ppm of HCl, fine grains, nanotwinned copper, and one or more additives, wherein the fine grains and nanotwinned copper have a weight ratio of 30:70.

In an embodiment, the at least one RDL structure further contains a protective layer for preventing oxidation.

In an embodiment, the at least one RDL structure exhibits a reduction in oxidation rate by at least 10% in comparison to conventional copper structures.

In an embodiment, the at least one RDL structure increases an electromigration lifetime by at least 50% at a current density ranging from $2\times10^6$ A/cm$^2$ to $4\times10^6$ A/cm$^2$.

Preferably, the at least one RDL structure increases an electromigration lifetime by at least 50% at a current density of $4\times10^6$ A/cm$^2$.

More preferably, the at least one RDL structure increases an electromigration lifetime by at least 190% at a current density of $4\times10^6$ A/cm$^2$ after resting for 2 days.

In an embodiment, the RDL structure includes two distinct line sizes, with one configuration featuring a line width and pitch of 2 μm, and the other configuration having both the line width and pitch set at 10 μm.

In an embodiment, the substrate is selected from the group consisting of silicon, glass, or organic substrates.

In an embodiment, the plurality of conductive connectors includes wire bonds, solder balls, or copper pillars, providing versatile options for external connections.

In another aspect, the present invention provides a method for manufacturing the IC package. The method includes placing a die on a substrate; depositing a first dielectric layer over the die as an insulation layer, wherein numerous via holes are etched within the first dielectric layer to establish, one or more trenches; forming a redistribution layer (RDL) structure on the surface of the die, wherein the RDL structure comprises a composite copper structure combining fine grains and nanotwinned copper; electrically connecting the die to a plurality of conductive connectors through the RDL structure; and forming an encapsulation layer on top of at least one redistribution layer to obtain the IC package.

In an embodiment, the one or more additives include an accelerator and an inhibitor. The accelerator includes sodium methanesulfonate, propansulfonic acid salts, or a combination thereof. The inhibitor includes polyoxyethylene, poly(p-phenylene oxide), or a combination thereof.

In an embodiment, the RDL structure is formed by a process involving deposition, photolithography, and etching to create a controlled distribution of nanotwins within the copper.

In an embodiment, the step of forming the RDL structure includes sputtering a vapor-phase deposited liner to a wafer surface as a diffusion barrier and depositing a copper seed layer; forming a patterned photoresist (PR) on the wafer surface through photolithography; electroplating said electroplating copper solution into the one or more trenches to form the RDL structure; removing the PR, the vapor-phase deposited liner and the copper seed layer by etching; and inevitably etching and roughening the top surface of the RDL structure.

In another embodiment, the method further including a step of depositing a second dielectric layer above the RDL structure, followed by repeating the step of forming RDL structure to form other RDL structures in the IC package.

In an embodiment, the vapor-phase deposited liner comprises Ti, TiN, or TaN . . .

BRIEF DESCRIPTION OF THE DRAWINGS

Embodiments of the invention are described in more details hereinafter with reference to the drawings, in which.

DETAILED DESCRIPTION

In the following description, a composite copper (Cu) structure for RDL circuits, and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
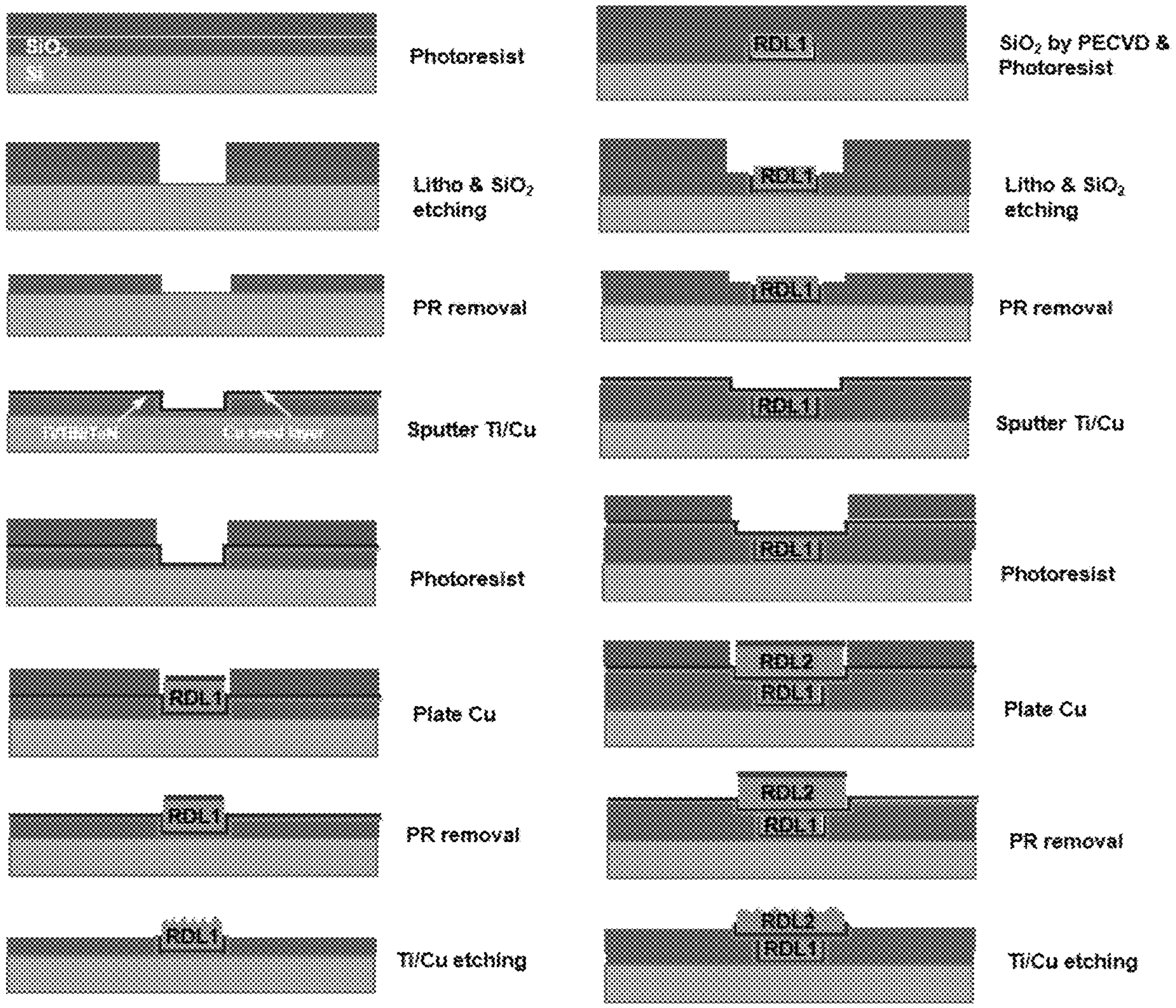
FIG. 1 shows a schematic diagram of typical manufacturing process for RDL.

Referring to FIG. 1, a schematic diagram of a typical manufacturing process for RDL is provided. The RDLs consist of a multi-layer structure, with the initial layer typically comprising a dielectric layer on a substrate. Within the dielectric layer, numerous via holes are etched to establish connections between the underlying metal lines in the device. The via holes play a crucial role in the RDL process by establishing connections between different layers. In the manufacturing of multi-layer structures for semiconductor devices, signal transmission and power distribution are essential between distinct layers. The via holes are openings that penetrate through these layers, allowing the flow of electric current and signals among them. Subsequently, a vapor-phase deposited liner (e.g., Ti, TiN, or TaN) is applied, followed by a Cu seed layer. The liner functions as an adhesive layer to enhance the adhesion of Cu to the dielectric layer and as a diffusion barrier to prevent Cu from reaching Si. By photolithography, a patterned photoresist (PR) is formed on the wafer surface. Then, Cu is electroplated into the trenches and via holes simultaneously. After PR removal, the liner and Cu seed layer are removed by another two etch processes, respectively. Meanwhile, the top surface of Cu RDL (RDL-1) is inevitably etched and roughened. After depositing a second dielectric layer, the said processes can be repeated to formed other Cu RDLs.

In the dual damascene process for internal chip interconnects, via holes and trenches are etched simultaneously in the dielectric layer. In other words, the formation of both via holes and trenches occurs concurrently and within the same dielectric material layer. Consequently, chemical mechanical polishing (CMP) is required in this process because there is an over-plated surface of copper that needs to be leveled. In contrast, the RDL process of the present invention differs from the dual damascene process, where the via holes and trenches are not etched simultaneously in the dielectric layer. Due to this distinction, chemical mechanical polishing (CMP) is not necessary in the RDL process since there is no over-plated surface of copper that requires to be leveled.

Similar to CMP step used to complete the Cu top surface in the dual damascene process, the etch process produces the top surface of the Cu RDL. Notably, in this context, both Cu surfaces do not adhere to the dielectric layer above. Within the structure of a Cu metal interconnect, dislocations and grain boundaries serve as sources of vacancies, yet the free surface stands out as the primary and most effective source of vacancies. Thus, atomic diffusion on these Cu surfaces become the “built-in” mass transport path for EM.

Besides, the liner between the Cu via holes and its underlying Cu line is an interface of flux divergence. Consequently, these two points emerge as weak links where Electromigration (EM) failure is prone to occur, with the degree of vulnerability potentially contingent on process control.

The fabrication of RDL circuits typically involves an etching process to remove the exposed sputtered Cu seed layer and Ti barrier layer, inevitably causing roughening of the Cu surface of the RDL. Unlike CMP, which uses oxide/corrosion inhibitors (e.g., benzotriazoles) during the process, the unprotected top surface of Cu RDL is more susceptible to oxidation after etching. The surface oxidation results in poor adhesion to the dielectric layer above it, potentially resulting in reliability concerns due to increased void nucleation and atomic diffusion. These challenges become particularly pronounced under thermal stress during device operation, accentuating the significance of considering electron migration when addressing the q-time issue in actual production.

Figure 2:
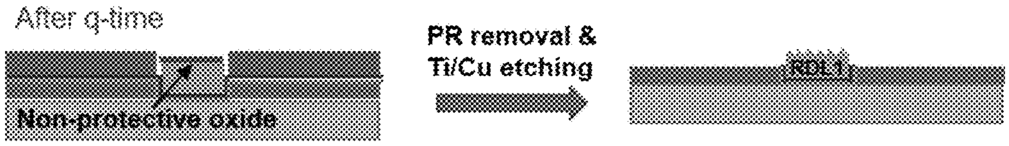
FIG. 2 shows a q-time issue in real production.

Referring to FIG. 2, with an increase in the post-plating resting time (q-time), the oxidation of the Cu surface intensifies, leading to exacerbated surface roughness after etching. A non-protective oxide tends to grow on the Cu RDL surface, becoming the main source and sink of vacancies. Taking into account the challenges inherent in RDL fabrication and the emerging trend of small RDL dimensions carrying increased current density, it becomes apparent the Cu surface of RDL plays a crucial role in ensuring the reliability and functionality of advanced packaging technology. Therefore, special attention should be paid to the surface quality of the Cu layer to prevent surface roughness and oxidation issues that could lead to potential reliability problems.

In light of these challenges, the present invention provides an IC package, including a substrate, a die on the surface of the substrate, a dielectric layer over the die, a conductive feature, at least one RDL structure situated on the surface of the dielectric layer, and a plurality of conductive connectors electrically connected to the die through the at least one RDL structure, enabling electrical connections between the die and external components. The at least one RDL structure having a composite copper structure combining fine grains and nanotwinned copper.

The RDL structure having a composite copper structure has two distinct line sizes, with one configuration featuring a line width and pitch of 2 μm, and the other configuration having both the line width and pitch set at 10 μm.

The RDL structure having a composite copper structure increases an electromigration lifetime by at least 50% at a current density of $4\times10^{6}$ A/cm$^{2}$. In addition, the RDL structure having a composite copper structure increases an electromigration lifetime by at least 190% at a current density of $4\times10^{6}$ A/cm$^{2}$.

Figure 3:
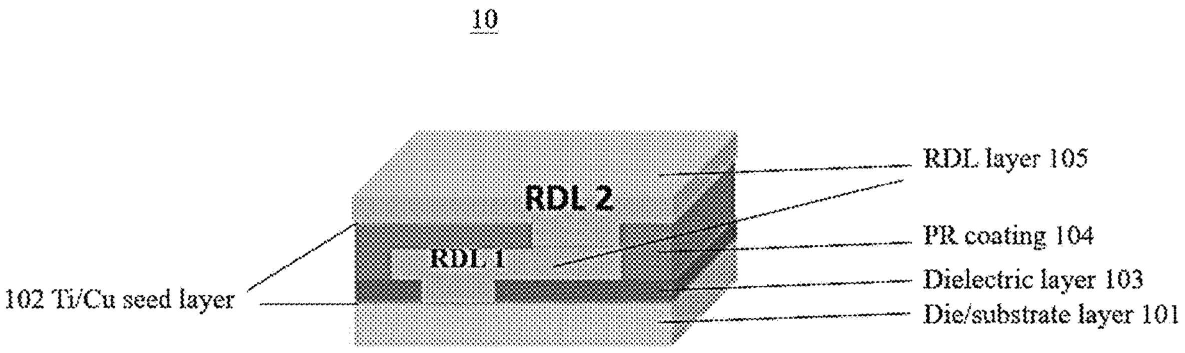
FIG. 3 shows a 3D schematic diagram of RDLs with multiple layers.

FIG. 3 depicts a three-dimensional schematic diagram illustrating the configuration of the IC package 10. First, a die is situated on the surface of the substrate layer 101. Then, a dielectric layer 103 is formed on the die through photolithography. Following an etching process, a Ti/Cu seed layer 102 is deposited onto the wafer surface. Next, a PR coating 104 is spin-coated on the PI surface through photolithography. A hybrid copper solution is electroplated into the trenches, giving rise to the formation of the RDL layer 105 with a composite copper structure.

A second dielectric layer 103 can be formed on the RDL layer 105 to allow subsequent stacking of other RDL structures and additional layers. Following the addition of the second dielectric layer, the aforementioned steps can be repeated. In one embodiment, the IC package has at least two RDL structures.

In one embodiment, the dielectric materials of the dielectric layer may include, but are not limited to, polyimide (PI) coating, SiO2, and other low K dielectric constant materials e.g. Si-based polymers, organic aromatic polymers.

In one embodiment, the substrate may include, but is not limited to, silicon, glass, or organic substrates.

In one embodiment, the plurality of conductive connectors may include, but are not limited to, wire bonds, solder balls, or copper pillars, providing versatile options for external connections.

In one embodiment; the RDL may further including multiple connection points that are connected to corresponding regions in other encapsulation layers to achieve electrical connection with external systems.

Nanotwinned copper exhibits superior mechanical properties, such as heightened strength and increased tensile ductility, in comparison to copper with conventional grain boundaries. The enhanced mechanical characteristics can be attributed to the presence of twins that act as stress-relieving mechanisms, thereby stabilizing the microstructure and bolstering the strength of the nanotwinned copper film. Additionally, nanotwinned copper displays elevated electrical conductivity, attributed to twin boundaries causing less significant electron scattering compared to grain boundaries. Moreover, nanotwinned copper demonstrates exceptional thermal stability, likely stemming from twin boundaries having excess energy at an order of magnitude lower than that of grain boundaries. The material also facilitates high copper atom diffusivity, which proves beneficial for copper-to-copper direct bonding. Notably, nanotwinned copper exhibits robust resistance to electromigration, attributed to twin boundaries impeding atomic diffusion induced by electromigration. This resistance is particularly advantageous in applications requiring fine-line redistribution layers. Furthermore, nanotwinned copper displays remarkable resistance to seed etching, a critical feature in fine-line redistribution layer applications. The material also exhibits low impurity incorporation, resulting in fewer Kirkendall voids due to soldered reactions with the nanotwinned copper.

The at least one RDL structure exhibits improved reliability in high-density operation. In one embodiment, the composite copper structure is formed by electroplating a electroplating copper solution comprising 0.4 M to 0.6 M of $CuSO_4 \cdot 5H_2O$, 70-100 g/L $H_2SO_4$, 30-50 ppm of HCl, fine grains, nanotwinned copper, and one or more additives, wherein the fine grains and nanotwinned copper have a weight ratio of 30:70. The composite copper structure is crucial for fanning out circuits and for 2.5D/3D IC packaging. Structurally stable fine-grain/nanotwin hybrid copper can effectively resist copper surface damage even after a long q-time, offering a promising solution for finer RDL for advanced packaging technologies.

In another aspect, the present invention also provides a method for manufacturing the IC package. The method includes placing a die on a substrate; depositing a first dielectric layer over the die as an insulation layer; forming a redistribution layer (RDL) structure on the surface of the die; electrically connecting the die to a plurality of conductive connectors through the RDL structure; and forming an encapsulation layer on top of at least one redistribution layer to obtain the IC package. Notably, the RDL structure includes a composite copper structure combining fine grains and nanotwinned copper. The RDL structure is formed by a process involving deposition, photolithography, and etching to create a controlled distribution of nanotwins within the copper.

In one embodiment, numerous via holes are etched within the first dielectric layer to establish one or more trenches.

Moreover, the steps of forming the RDL structure include applying a vapor-phase deposited liner to a wafer surface as a diffusion barrier and depositing a copper seed layer; forming a patterned photoresist (PR) on the wafer surface through photolithography; electroplating an electroplating copper solution into the one or more trenches to form the RDL structure; removing the PR, the vapor-phase deposited liner and the copper seed layer by etching; and inevitably etching and roughening the top surface of the RDL structure.

In one embodiment, the vapor-phase deposited liner may include, but is not limited to, Ti, TiN, or TaN. The vapor-phase deposited liner is used to enhance adhesion and prevent copper diffusion into the dielectric layer.

In another embodiment, a second dielectric layer can be deposited above the RDL structure, followed by repeating the step of forming RDL structure to form other RDL structures in the IC package.

In one embodiment, the one or more additives may include an accelerator and an inhibitor. The accelerator may include sodium methanesulfonate, propansulfonic acid salts, or a combination thereof. The inhibitor may include polyoxyethylene, poly(p-phenylene oxide), or a combination thereof.

In one embodiment, two distinct copper composites, high-ratio nanotwin structure (HTN) and low-ratio nanotwin structure (LTN), were provided. HTN contains 60-80 wt % of twin copper, and LTN contains 20-40 wt % of twin copper. The comparative analysis between the two copper composites revealed that HTN copper exhibited superior resistance to annealing recrystallization and greater structural stability. The HTN composite Cu displayed a lower oxidation rate and enhanced corrosion resistance, as evidenced by roughness measurements, Tafel curves, and EIS Bode plots. Furthermore, the HTN RDL showcased heightened resistance to electromigration, boasting an Electromigration (EM) lifetime much longer than that of coarse grain RDL. These findings underscore the substantial potential of the composite copper structure in advancing the realization of finer RDL within cutting-edge packaging technologies.

EXAMPLE

Example 1

Preparation of RDL Structure

A CHI 660*e* electrochemical workstation was utilized for electroplating copper films and RDL with a constant current. The process was carried out at room temperature (25±2° C.), with a stirring speed of 800 rpm and a current density of 4-5 ASD. A phosphorus copper plate served as the anode, and a silicon wafer coated with a 100 nm Ti and 100 nm Cu seed layer functioned as the cathode. Prior to electroplating, the silicon wafer was patterned using photolithography, and the unwanted Ti and Cu layers were removed afterward.

First, a patterned polyimide (PI) was formed on the incoming wafer surface through photolithography, followed by the deposition of a titanium/copper seed layer. A patterned photoresist (PR) was then spin-coated on the PI surface through photolithography, and copper was electroplated into the trenches. Electroplating solutions contained 0.4-0.6 M of $CuSO_4 \cdot 5H_2O$, 90 g/L $H_2SO_4$ (Sigma-Aldrich), 40 ppm of HCl (Sigma-Aldrich), and various additives (e.g., accelerators, inhibitors provided by Intervia 8540, DuPont). Composite Cu films with varying nanotwin ratios were synthesized by adjusting the accelerator and inhibitor ratios in the solution.

After PR removal, the exposed Cu seed layer/liner were etched away and the first layer of RDL (RDL-1) was formed. Here, the top surface of the RDL-1 was inevitably etched and roughened. After that, the above steps were repeated to form the second RDL (RDL-2). Finally, a composite copper structure was obtained.

Example 2

Performance Characterization of RDL Structure

Vertical growth twin (VNT) copper and composite Cu with high-ratio nanotwins (HTN) were compared for superfilling capability analysis. For q-time issue and electromigration analyses, regular coarse-grain copper (CGC) and HTN were selected. Furthermore, HTN composite copper with fine grain and low ratio nanotwins (LTN) were used to investigate the effects of twin content on structural stability. The top surface microstructures of different copper films were characterized using focused ion beam (FIB, Quanta 200 3D and Helios Nano lab 600i, FEI), transmission electron microscope (TEM, FEI Tecnai G2) and electron backscatter diffraction (EBSD, Oxford HKL Channel 5). Polarization characterization was conducted in a three-electrode cell containing 300 ml of 3.5% NaCl solution, prepared by mixing deionized water with NaCl. A Cu line pattern was designed for electromigration testing, which was performed at 175° C. on a hotplate with an applied current density of $4\times10^6$ A/cm$^2$. A four-point probe system recorded the electrical resistance during electromigration testing.

Superfilling Capability and Structural Stability of HTN and LTN Copper Films

Figure 4A:
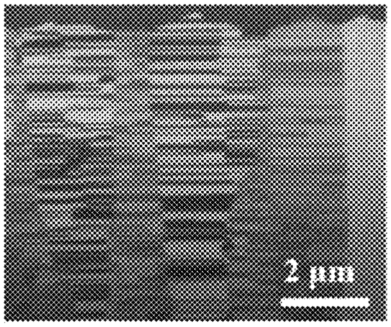
FIG. 4A shows a focused ion beam (FIB) image of typically vertical growth of nanotwin (VNT) structures on the planar sputtered Cu seed layer.
Figure 4B:
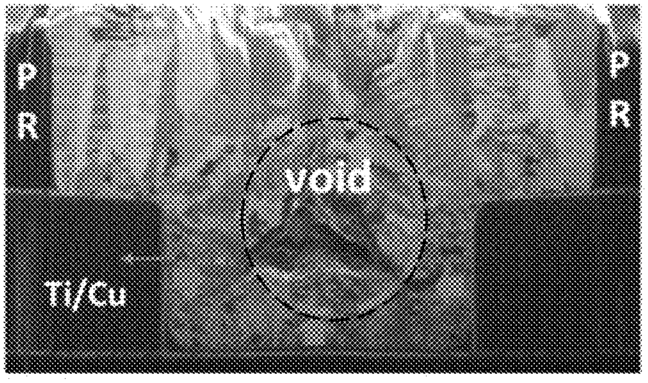
FIG. 4B shows a FIB image of VNT popper when filling a pattern with via holes, forming a void (circle) in the center due to the simultaneous growth of nanotwins in three directions along the seed layer.

Referring to FIG. 4A, which showed the focused ion beam (FIB) image of typically vertical growth of nanotwin (VNT) structures on the planar sputtered Cu seed layer, demonstrating that specialized additives in the electrolyte can assist in directing the vertical growth of nanotwin structures. Despite this, FIG. 4B showed that the simultaneous growth of nanotwins in three different directions along the seed layer could lead to void formation in the center when plated on a patterned wafer with the via structure.

Figure 5A:
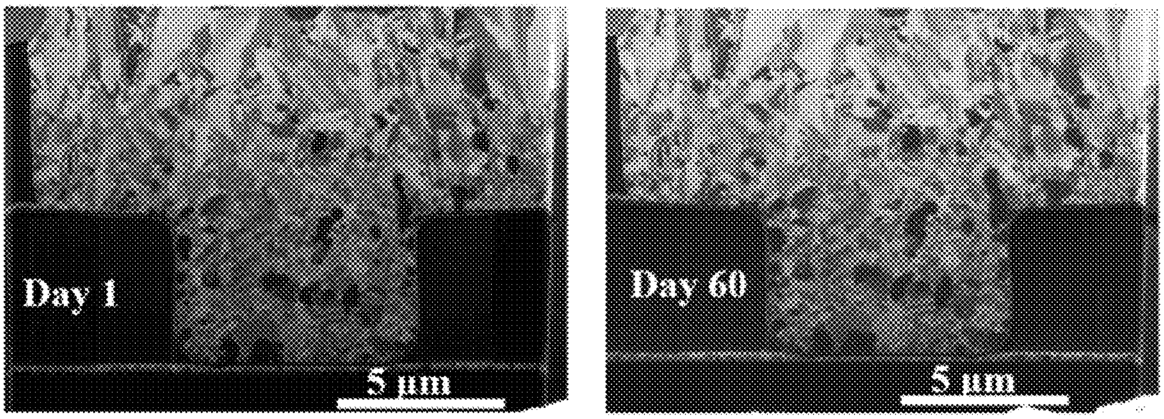
FIG. 5A shows cross section images of the composite copper when filling via holes for 1 and 60 days storage.
Figure 5B:
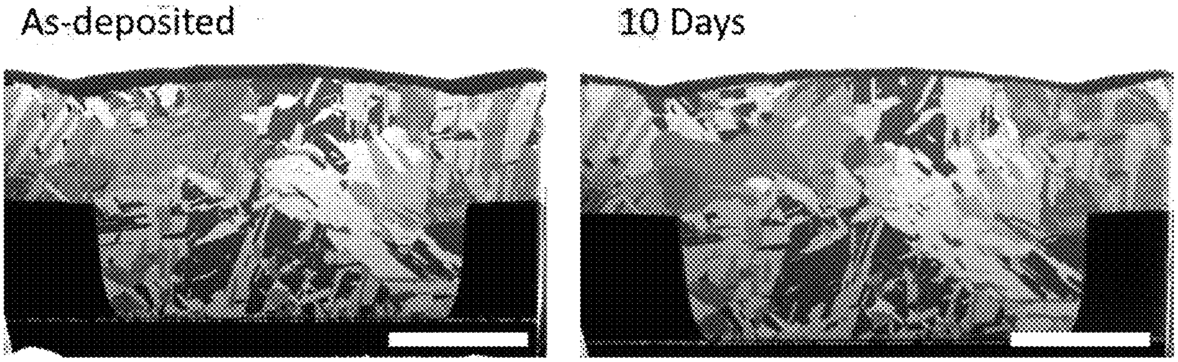
FIG. 5B shows superfilling capability and structural stability of the hybrid Cu without self-annealing effect. Scale bar=5 mm.
Figure 5C:
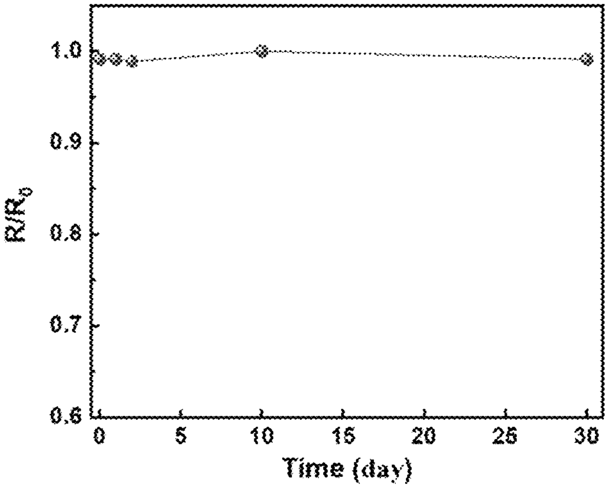
FIG. 5C shows sheet resistance evolution of composite copper film at room temperature.

To address this issue, this example combined and optimized additives to form a composite Cu structure in which fine grains and nanotwins coexisted. As demonstrated in the FIB images of FIGS. 5A-5B, this composite Cu structure with nanotwins and fine grains achieved both superfilling capability and structural stability without the self-annealing-induced crystal growth effect, even after 60 days of storage. This is further supported by the sheet resistance evolution of the composite copper film at room temperature, as shown in FIG. 5C.

Figure 6A:
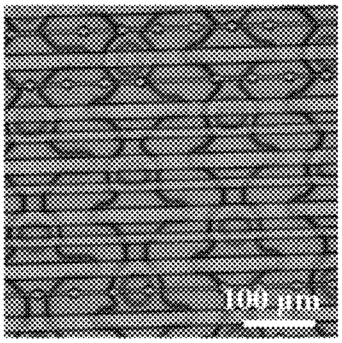
FIGS. 6A-6C show. OM images of stacked second RDL based on RDL1 surface.
Figure 6B:
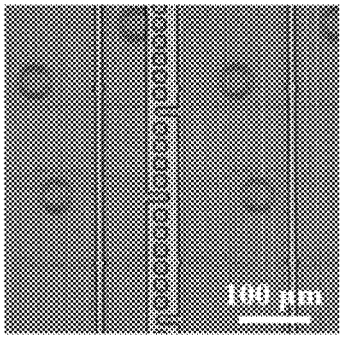
Figure 6C:
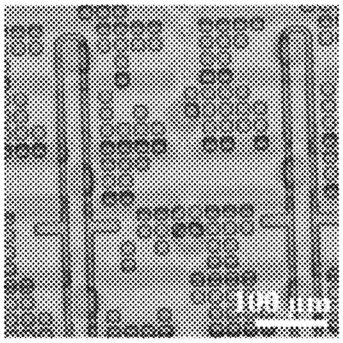
Figure 6D:
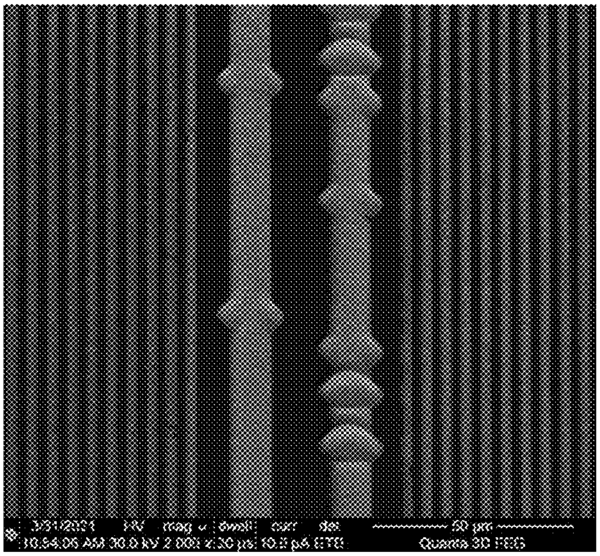
FIG. 6D shows a SEM image of RDL lines.

Beyond material properties, critical considerations were given to factors such as superfilling capability and a sufficiently high plating rate, both of which were essential requirements for practical; IC manufacturing. The optical morphologies (OM) images of stacked RDL2 on the surface of RDL1 were shown in FIGS. 6A-6C. The RDLs involve two distinct line sizes, one configuration features a line width and pitch of 2 μm, while the other configuration has both the line width and pitch set at 10 μm (FIG. 6D).

Moreover, to evaluate the impact of twin ratio on structural stability, two types of copper nanotwin/nanograin composites were produced by regulating the additives in the plating solution. They were named high-ratio nanotwin structure (HTN) and low-ratio nanotwin structure (LTN).

Figure 7A:
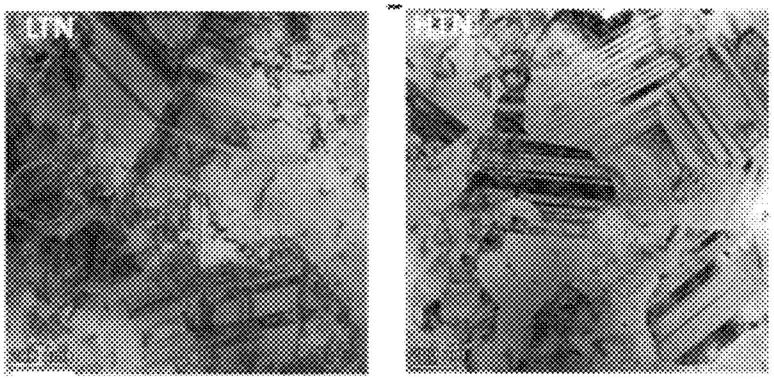
FIG. 7A shows TEM images of LTN and HTN according to an embodiment of the present invention.
Figure 7B:
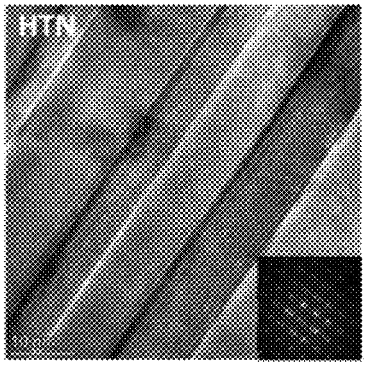
FIG. 7B shows a high-resolution image of HTN, with the inset of electron diffraction pattern.

The twin ratio was defined as the total length of twin boundaries divided by the total length of all grain boundaries. The microstructural characterization of two different of electroplated composite copper was measured. FIG. 7A illustrated the transmission electron micrographs of the as-prepared LTN and HTN samples, where the circles in each figure indicated nanograins were embedded between larger grains and twin grain boundaries. It was apparent that LTN copper had a higher density of fine grains and fewer twin boundaries per unit area than HTN copper, as further demonstrated in the misorientation distribution of LTN and HTN grain boundaries in FIG. 8B. There were two different nanotwin boundaries in face-centered-cubic copper crystals: $\Sigma3\{111\}$ coherent twin boundary (CTB) and $\Sigma3\{112\}$ incoherent twin boundary (ITB). A high-resolution image of HTN copper (FIG. 7B), along with the inset of the electron diffraction pattern, presented the typical CTB of HTN copper. This suggests that HTN copper may have higher thermal stability than copper with few nanotwins, because coherent twin boundaries (CTBs) have much lower energy than that of incoherent twin boundaries (ITBs) and high-angle grain boundaries.

Figure 7C:
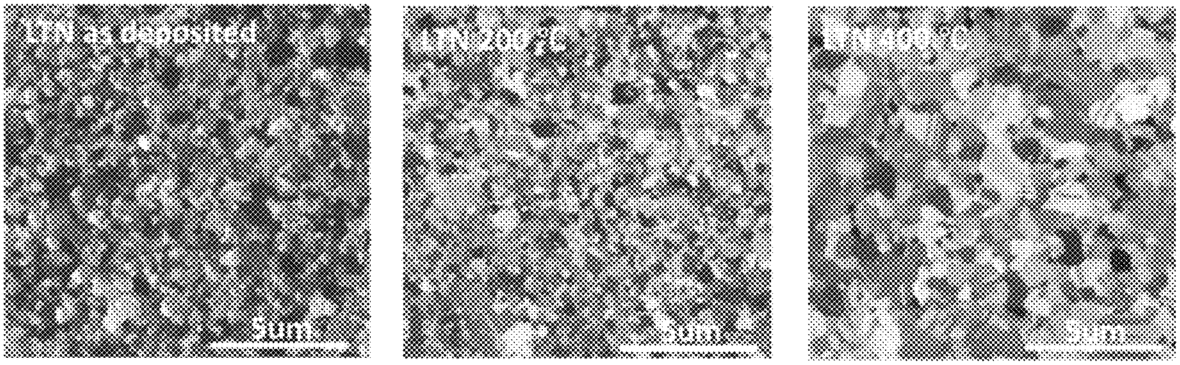
FIG. 7C shows FIB images of LTN copper after annealing at room temperature, 200, and 400° C.
Figure 7D:
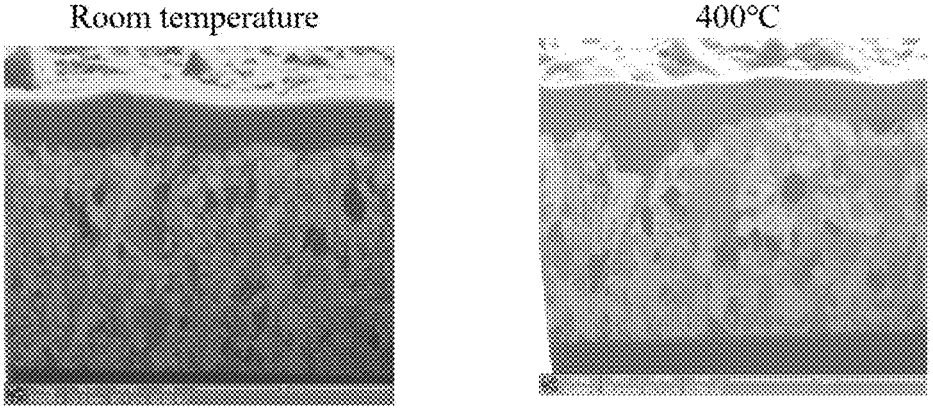
FIG. 7D shows cross section images evolution of LTN sample at room temperature and 400° C.
Figure 7E:
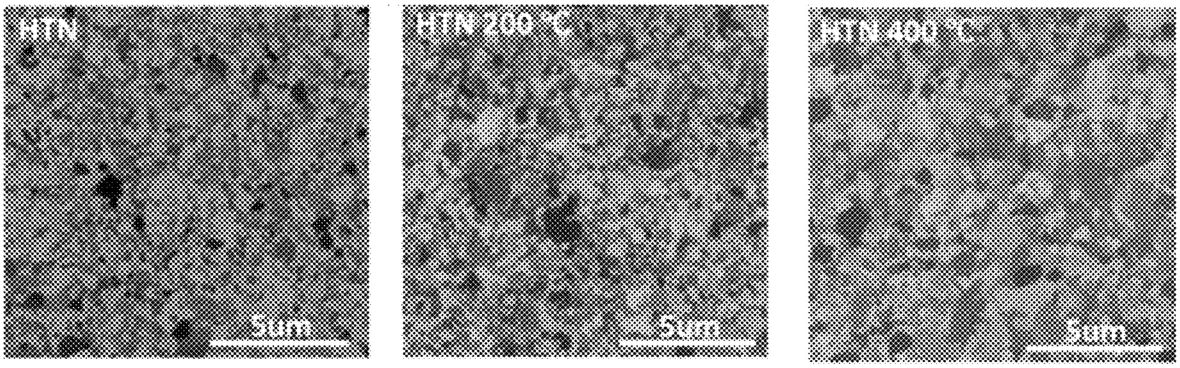
FIG. 7E shows FIB images of HTN copper after annealing at room temperature, 200 and 400° C.
Figure 7F:
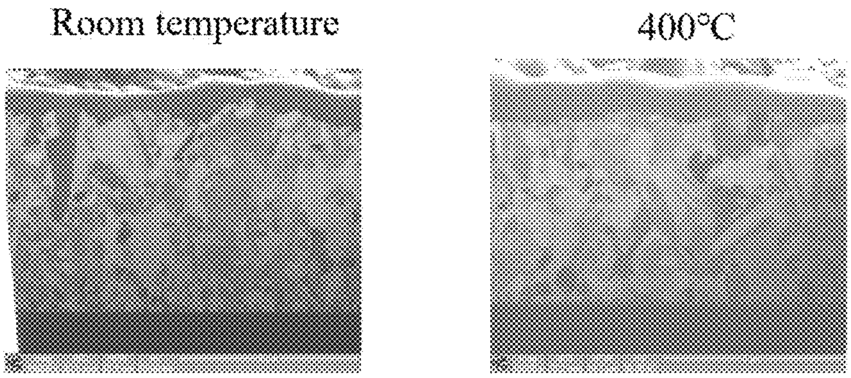
FIG. 7F shows cross section images evolution of HTN sample at room temperature and 400° C.

Additionally, both as-deposited LTN and HTN copper were annealed at room temperature, 200° C., and 400° C. for 30 minutes, respectively. To further compare the thermal stability difference between LTN and HTN copper, the evolution of the microscopic morphology of LTN copper during the annealing process was recorded with FIB surface and cross-section images in FIGS. 7C-7D. The evolution of the microscopic morphology of HTN copper during the annealing process was recorded with FIB surface and cross-section images in FIGS. 7E-7F. These FIB images indicated the as-deposited LTN copper experienced grain growth and formation of annealing twins after annealing at 200° C., and further experienced larger grain growth after annealing at 400° C. for 30 min. In contrast, the HTN copper film with a higher density of CTBs showed slight grain growth at 400° C., thereby suggesting enhanced resistance to thermal fatigue.

Figure 8A:
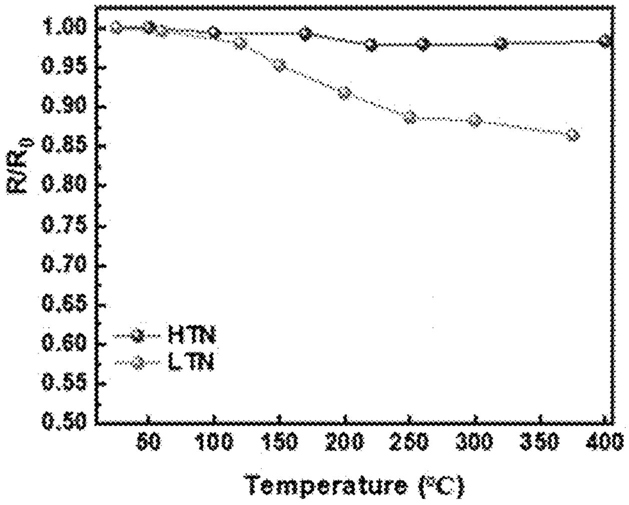
FIG. 8A shows sheet resistance changes of the plated HTN and LTN Cu during the thermal annealing process.

To further verify the structural stability of HTN and LTN Cu from an electrical perspective, sheet resistance changes were measured using four-wire technique after 30-min annealing at different temperatures. FIG. 8A indicates that the LTN copper film experienced a considerable decrease in sheet resistance (13.5%) at 400° C. annealing, while the HTN film only decreased by about 3%. The high thermal stability could be attributed to its unique grain boundary (GB) network.

Figure 8B:
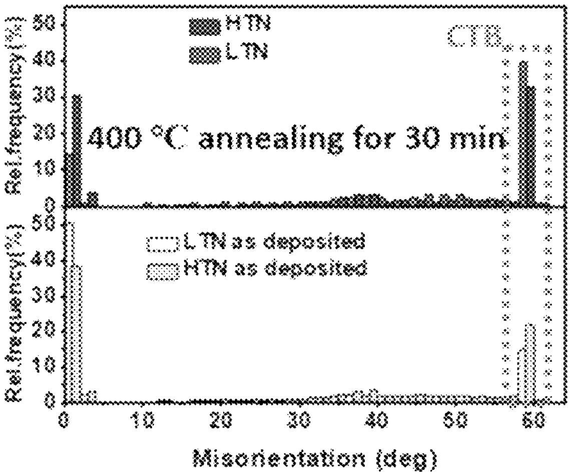
FIG. 8B shows misorientation distribution of the grain boundaries of LTN and HTN before and after annealing at 400° C.
Figure 8C:
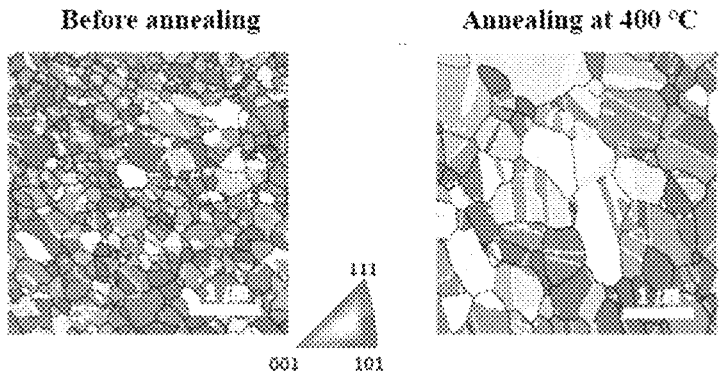
FIG. 8C shows EBDS IPF-Z mapping for LTN sample before and after at 400° C. annealing.
Figure 8D:
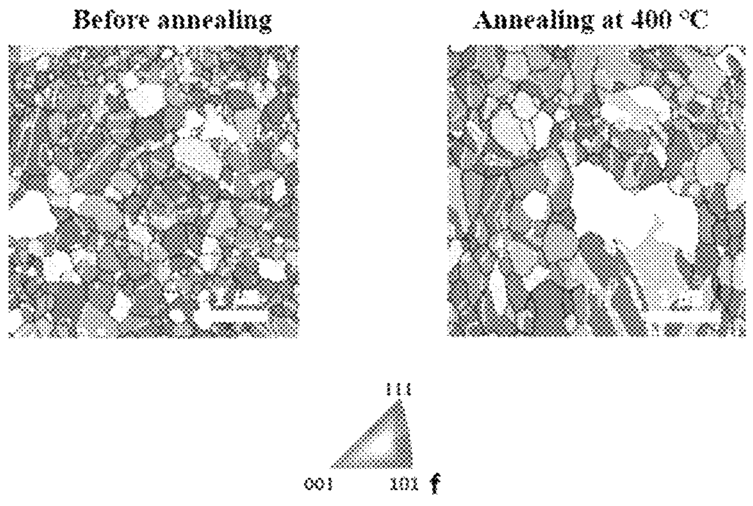
FIG. 8D shows EBDS IPF-Z mapping for HTN sample before and after at 400° C. annealing. All the scale bars represent 1 μm.

FIG. 8B summarized the misorientation distribution of LTN and HTN grain boundaries before and after annealing at 400° C. It showed that the $\Sigma3\{111\}$ CTB ratio of pre-prepared LTN was about 14.7% prior to annealing, which was far lower than that of HTN (23.5%). After annealing at 400° C., the twin proportion of LTN increased to 40%, while that of HTN increased to only 32.4%. The lower annealing twin formation of 8.9% for HTN compared to 25.3% for LTN indicated that HTN copper had stronger structural stability than LTN. Similar results were also observed in the EBSD top-surface grain orientation maps in FIGS. 8C-8D. After annealing at 400° C. for half hour, the LTN film exhibited a significant increase in average grain size from 127 to 352 nm, accompanied by the straightening of grain boundaries. In contrast, HTN film showed a slight increase in average grain size from 156 to 198 nm. These results suggest that high-twin composite copper can effectively restrict recrystallization and enhance thermal stability.

Corrosion Resistance

It is generally accepted that Cu is an FCC metal and the (111) plane has the least dangling bond compared with other planes and has less bonding with oxygen during the oxidation process. Thus, the oxidation rate of the composite Cu with nanotwin structure should be less than the normal coarse-grain Cu.

Figure 9A:
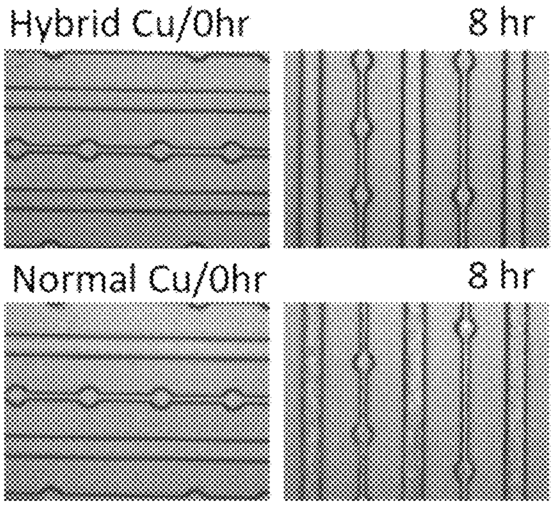
FIG. 9A shows OM images showing surface morphologies of hybrid Cu/normal coarse-grain Cu noted by the time after as-deposited for etching.
Figure 9B:
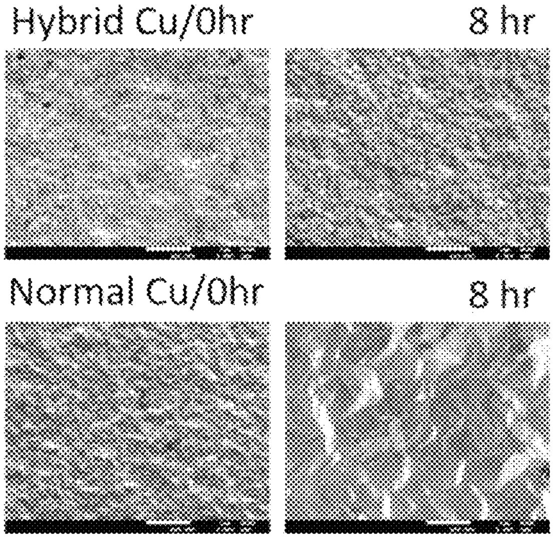
FIG. 9B shows SEM images showing surface morphologies of hybrid Cu/normal Cu noted by the time after as-deposited for etching.

In the optical microscopy (OM) images of FIG. 9A, the hybrid copper exhibited superior corrosion resistance and lower surface roughness after the etching process with an 8-hr q-time compared to the normal coarse-grain Cu, In the SEM images of FIG. 9B, less non-protective oxide grew on the hybrid Cu RDL surface, decreasing the sink of vacancies, especially may be more stable during device operation. However, the surface of coarse grain Cu exhibited a significantly rougher texture than that of HTN composite copper after being stored at room temperature for 8 hours and then etched. This could be due to the difference in grain boundary network. Increasing the fraction of special (23) grain boundaries helps to interrupt the continuity of ordinary grain boundaries. As a result, the intergranular corrosion through ordinary grain boundaries can be significantly inhibited.

Figure 10A:
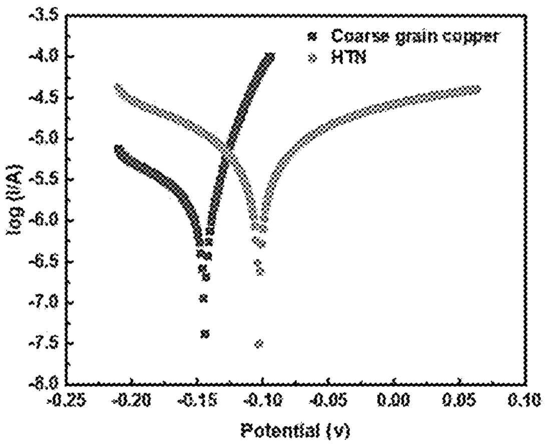
FIG. 10A shows Tafel polarization curves of both hybrid Cu and normal coarse-grain Cu in the 3.5% NaCl solution.

To further understand the difference in corrosion resistance between the two types of copper, Tafel polarization curves acquired for the coarse-grain and HTN samples in 3.0% sodium chloride were illustrated in FIG. 10A. Compared to the coarse-grained copper, the presence of a high ratio nanotwin in HTN copper resulted in a significantly higher corrosion potential ($E_{corr}$) and a lower corrosion current density ($I_{corr}$), leading to substantially improved corrosion resistance in a 3.0%. NaCl solution. This enhanced corrosion resistance can be attributed to the coherent twin boundaries found in HTN copper.

Figure 10B:
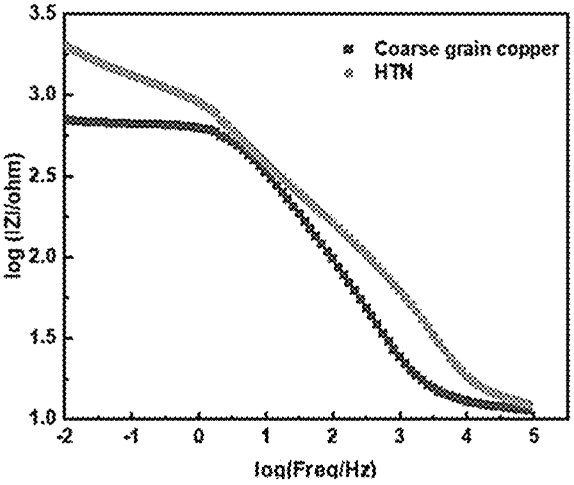
FIG. 10B shows EIS Bode plots of both hybrid Cu and normal coarse-grain Cu in the 3.5% NaCl solution.

Additionally, FIG. 10B displayed the EIS impedance modulus Bode plots of both normal coarse-grain and HTN copper samples. The measurements were recorded across a frequency range of 100 kHz-10 mHz with an amplitude of 5 mV. The impedance modulus values at a frequency of 10 mHz (|Z|) could be used as an indicator of corrosion resistance. The EIS plots revealed |Z| values of 710Ω for the coarse-grained copper and 2030Ω for HTN copper samples. The higher |Z| value for HTN copper indicated superior corrosion resistance compared to normal coarse-grain copper.

EM Test

The failure mechanisms of EM were investigated by subjecting the samples to high current density injection.

Figure 11:
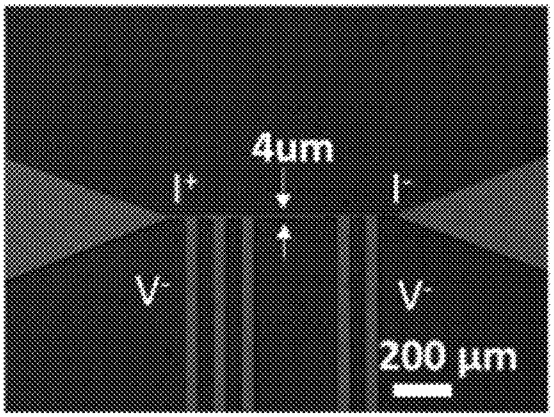
FIG. 11 shows a typical plan-view SEM image of EM testing setup.

In integrated circuits, decreasing the line width of RDL below 5 μm can result in severe EM issues and Joule heat stress. Therefore, fine RDL copper lines were specifically designed for EM characterization, and a typical SEM image of a Cu line with dimensions of approximately 800 μm in length, 4 μm in width, and 3.5 μm in height was presented in FIG. 11.

Figure 12:
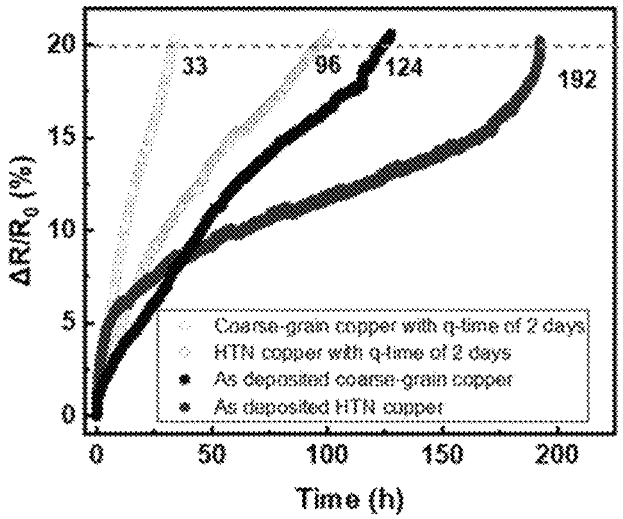
FIG. 12 shows a comparison of the resistance changes of the deposited normal coarse-grain Cu and HTN Cu before and after resting 2 days, under EM stressing.

In this example, the normal coarse-grain copper and HTN copper were deposited, and the electrical resistance changes with time were recorded by a four-point probe system during testing. The fine lines were caped with polyimide tape and fixed on a hotplate at 175° C. with a high current density of $4\times10^6$ A/cm$^2$. The RDL lifetime was defined as the duration of time during which the resistance increases by 20%. As depicted in FIG. 12, the coarse-grain and HTN copper films employed for EM testing exhibited lifetimes of around 124 hours and 192 hours, respectively.

Previous studies have reported that copper grains that contain CTBs can slow down grain-boundary and surface electromigration by means of triple junction, and copper RDL with a higher CTB density has been observed to exhibit a longer electromigration lifetime than regular copper RDL. Considering that in real chip manufacturing, chips coated with RDL are often placed in the warehouse for two or three days before being transferred to the subsequent manufacturing process. To simulate this process, the newly plated RDL was left at room temperature for 2 days after etching, prior to the EM test. After resting for 2 days, the EM lifetime of HTN RDL (96 h) was 2.9 times longer than that of the coarse-grain copper RDL (33 h), which could be attributed to its superior antioxidant ability.

Table 1 provides an overview of survey and benchmark comparison studies focusing on different copper structures for RDL applications.

TABLE 1

Summarizes the recent literature on the performance of RDL with various copper compositions

| | Current density (Å/cm$^2$) | Width (μm) | Height (μm) | Temperature (° C.) | Protective layer | Control group/ lifetime (h) | Target group/ lifetime (h) | Ratio of Increase (%) |
|---|---|---|---|---|---|---|---|---|
| Low current load | $1 \times 10^6$ | 10 | 5 | 200 | PI | CGC/160 | VNT/445 | 178 |
| | $1 \times 10^6$ | 10 | 5 | 200 | PI | CGC/120 | VNT/430 | 258 |
| | $1 \times 10^6$ | 10 | 8 | 180 | PI | CGC/75 | VNT/215 | 187 |
| | $1.05 \times 10^6$ | 20 | 5 | 75 | silicone oil | CGC/66 | VNT/96 | 45 |
| | $1 \times 10^6$ | 2 | 3 | 160 | PI | CGC/224 | VNT/255 | 14 |
| | $1.2 \times 10^6$ | 0.28 | 0.35 | 300 | — | — | CGC/80 | — |
| | $1.5 \times 10^6$ | 3 | — | 200 | graphene | CGC/154 | VNT/215 | 39.6 |
| High current load | $2 \times 10^6$ | 10 | 3 | 150 | — | — | CGC/42 | — |
| | $2 \times 10^6$ | 7.5 | — | 300 | Cr | — | CGC/43 | — |
| | $3 \times 10^6$ | 2 | 4.75 | 200 | PI | CGC/6 | VNT/12 | 100 |
| | $3 \times 10^6$ | 3 | — | — | Mo | — | CGC/2.5 | — |
| | $3.6 \times 10^6$ | 5 | — | 280 | — | — | CGC/2.8 | — |
| | $4 \times 10^6$ | 4 | 3.5 | 175 | PI tape | CGC/124 | HTN/192 | 54.5 (this work) |
| | $4 \times 10^6$ | 4 | 3.5 | 175 | PI tape | 2 d-CGC/33 | 2 d-HTN/96 | 191 (this work) |

TABLE 1-continued

Summarizes the recent literature on the performance of RDL with various copper compositions

| Current density (Å/cm$^2$) | Width (μm) | Height (μm) | Temperature (° C.) | Protective layer | Control group/ lifetime (h) | Target group/ lifetime (h) | Ratio of Increase (%) |
|---|---|---|---|---|---|---|---|

(a) CGC: coarse-grain copper;
(b) VNT: vertical growth twin copper;
(c)HTN: high-ratio nanotwins composite Cu;
(d) 2 d-CGC: CGC RDL rested for 2 days before electromigration test;
(e) 2 d-HTN: HTN RDL rested for 2 days before electromigration test.

(a) CGC: coarse-grain copper; (b) VNT: vertical growth twin copper; (c) HTN: high-ratio nanotwins composite Cu; (d) 2d-CGC: CGC RDL rested for 2 days before electromigration test; (e) 2d-HTN:HTN RDL rested for 2 days before electromigration test.

Table 1 indicated a general decrease in the lifetime of EM as the current density increases. When subjected to high current density (>2× $10^6$ A/cm$^2$), the utilization of HTN resulted in an EM lifetime exceeding 190 hours, positioning it at the forefront among the existing copper structures.

Figure 13A:
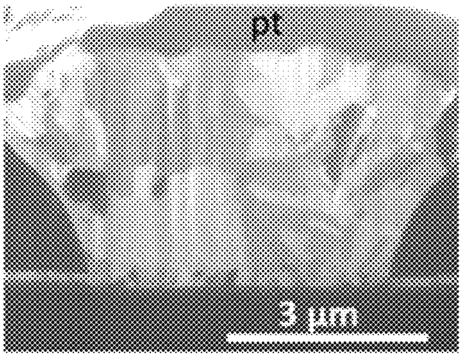
FIG. 13A shows a short-axis ion image of as deposited coarse-grain RDL at the anode end before EM test.
Figure 13B:
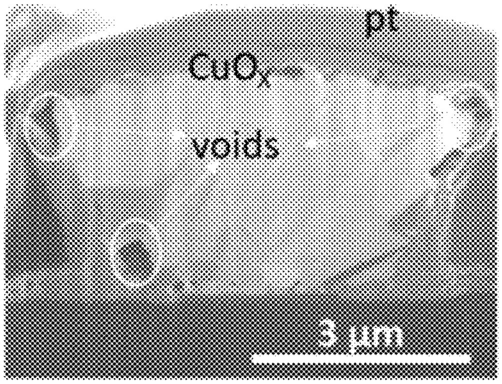
FIG. 13B shows a short-axis ion image of as deposited coarse-grain RDL at the anode end after EM test.
Figure 13C:
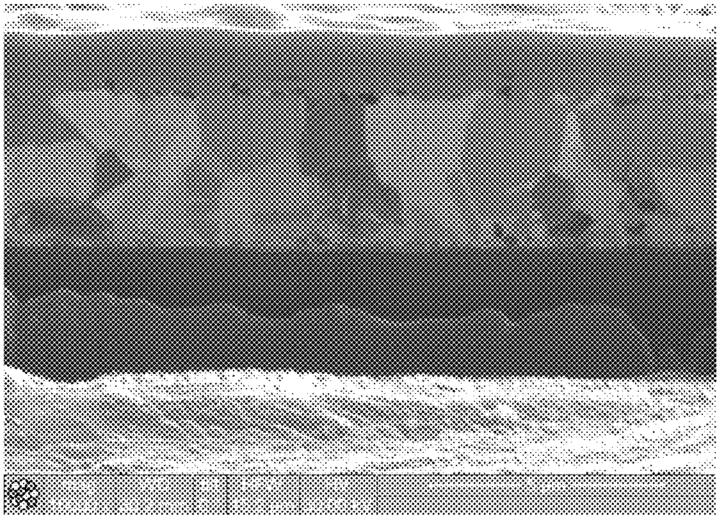
FIG. 13C shows a long-axis ion image of coarse-grain RDL after EM test.

To analyze the cause of failure, cross-sectional observations of the samples were conducted both before and after EM testing. FIG. 13A showed the short-axis ion image of as deposited coarse-grain RDL at the anode end. A thick oxide layer was observed on the surface of the as-deposited coarse-grain RDL after the EM test (FIGS. 13B-13C). This occurrence can be attributed to the incomplete prevention of oxygen and moisture penetration from the air, as the polyimide tape on the RDL may not provide full isolation. The observation of a few voids caused by EM between the copper line and oxide layer can be attributed to the fact that the diffusion rate of atoms at the surface and interface is much higher than that of internal grain boundaries.

Figure 14A:
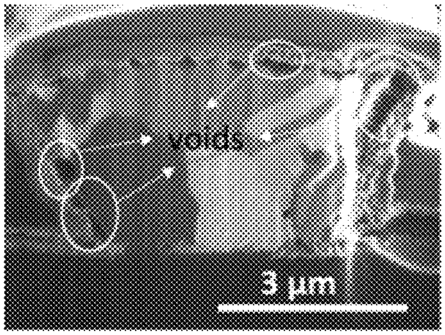
FIG. 14A shows a short-axis ion image of coarse-grain Cu (resting for 2 days before EM test) after EM test.
Figure 14B:
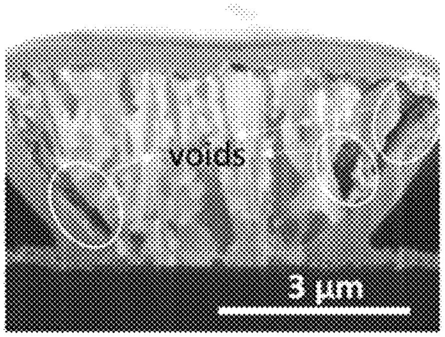
FIG. 14B shows a short-axis ion image of HTN Cu (resting for 2 days before EM test) after EM test. All the scale bars represent 3 μm.

Additionally, both the coarse-grain RDL and HTN RDL were stored for 2 days before EM testing, and their short-axis ion images after EM stressing were shown in FIGS. 14A-14B, respectively. It was observed that HTN and coarse-grained RDLs with resting for 2 days exhibited similar oxide layers and voids after EM testing. Generally, an increase in grain size leads to a decrease in the diffusivity of Cu atoms, which in turn suppresses their diffusion under EM stress and improves the EM lifetime. However, the HTN RDL with smaller grains of the present invention exhibited significantly better EM performance as compared to the coarse-grain RDL with larger grains. This improvement can be largely attributed to its superior anti-oxidation ability, as well as the capability of nanotwin boundaries to impede the diffusion of copper atoms.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

Definitions

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they allow for elements not explicitly recited, but exclude elements that are found in the prior art or that affect a basic or novel characteristic of the present invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the methods of preparation described herein, the steps can be carried out in any order without departing from the principles of the invention, except when a temporal or operational sequence is explicitly recited. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps can also be repeated. Furthermore, specified steps can be carried out concurrently unless explicit claim language recites that they be carried out separately.

The term "Σ3{111} CTB" stands for Sigma 3 (Σ3) twin boundaries with a crystallographic orientation of {111}. In materials science and crystallography, twin boundaries are interfaces between crystal grains that have different orientations. The Σ3 value indicates a special type of twin boundary, where the misorientation angle between the adjacent crystal lattices is such that it corresponds to a specific crystallographic symmetry (in this case, Σ3).

The term "nanotwins" refers to a specific structure within a crystal where adjacent crystal regions exhibit mirror symmetry, forming a twinned crystal structure, and this structure occurs at the nanoscale. The size of nanotwins is typically on the nanoscale, indicating the presence of very small twinned regions within the crystal.

The term "fine grains" refers to small-sized crystal grains within the crystal structure. Materials with fine grains often exhibit superior strength, hardness, and other mechanical properties due to an increased number of grain boundaries (interfaces between grains), which can impede displacement or deformation.

Other definitions for selected terms used herein may be found within the detailed description of the present invention and apply throughout. Unless otherwise defined, all other technical terms used herein have the same meaning as commonly understood to one of ordinary skill in the art to which the present invention belongs.

What is claimed is:

1. An IC package with nanotwinning-assisted structurally stable copper structure, comprising:

a substrate;

a die on the surface of the substrate;

a first dielectric layer covering the die, wherein the first dielectric layer comprises via holes;

at least one redistribution layer (RDL) structure situated on the surface of the dielectric layer, wherein the at least one RDL structure comprises a composite copper structure and at least one conductive feature; and a plurality of conductive connectors electrically connected to the die through the at least one RDL structure, enabling electrical connections between the die and external components;

wherein the nanotwinning-assisted structurally stable copper structure is formed as a single hybrid layer within the at least one RDL structure, the nanotwinning-assisted structurally stable copper structure comprises fine grains and nanotwinned copper in a weight ratio of 30:70, wherein the fine grains are dispersedly embedded between larger grains and nanotwin boundaries within the single hybrid layer;

wherein the at least one RDL structure exhibits a reduction in oxidation rate by at least 10% in comparison to conventional copper structures; and wherein the at least one RDL structure increases an electromigration lifetime by at least 50% at a current density ranging from $2\times10^6$ A/cm$^2$ to $4\times10^6$ A/cm$^2$.

2. The IC package of claim 1, wherein the IC package further comprises a second dielectric layer covering the first RDL structure to allow subsequent stacking of other RDL structures and additional layers.

3. The IC package of claim 1, wherein the composite copper structure is formed by electroplating a electroplating copper solution comprising 0.4 M to 0.6 M of $CuSO_4{\cdot}5H_2O$, 70-100 g/L $H_2SO_4$, 30-50 ppm of HCl, the fine grains, the nanotwinned copper, and one or more additives.

4. The IC package of claim 1, wherein the at least one RDL structure further comprises a protective layer for preventing oxidation.

5. The IC package of claim 1, wherein the at least one RDL structure increases an electromigration lifetime by at least 50% at a current density of $4\times10^6$ A/cm$^2$.

6. The IC package of claim 1, wherein the at least one RDL structure increases an electromigration lifetime by at least 190% at a current density of $4\times10^6$ A/cm$^2$ after resting for 2 days.

7. The IC package of claim 1, wherein the RDL structure comprise two distinct line sizes, with one configuration featuring a line width and pitch of 2 μm, and the other configuration having both the line width and pitch set at 10 μm.

8. The IC package of claim 1, wherein the substrate is selected from the group consisting of silicon, glass, or organic substrates.

9. The IC package of claim 1, wherein the plurality of conductive connectors comprise wire bonds, solder balls, or copper pillars, providing versatile options for external connections.

10. A method of manufacturing the IC package of claim 1, comprising:

placing a die on a substrate;

depositing a first dielectric layer over the die as an insulation layer, wherein numerous via holes are etched within the first dielectric layer to establish one or more trenches;

forming a redistribution layer (RDL) structure on the surface of the die, wherein the RDL structure comprises a composite copper structure combining fine grains and nanotwinned copper;

electrically connecting the die to a plurality of conductive connectors through the RDL structure; and forming an encapsulation layer on top of at least one redistribution layer to obtain the IC package;

wherein forming the RDL structure comprises electroplating the composite copper structure as a single hybrid layer into the one or more trenches, wherein the fine grains and the nanotwinned copper are co-deposited within the single hybrid layer in a weight ratio of 30:70 such that the fine grains are embedded between larger grains and nanotwin boundaries.

11. The method of claim 10, wherein the RDL structure is formed by a process involving deposition, photolithography, and etching to create a controlled distribution of nanotwins within the copper.

12. The method of claim 10, wherein step of forming the RDL structure comprising:

sputtering a vapor-phase deposited liner to a wafer surface as a diffusion barrier and depositing a copper seed layer;

forming a patterned photoresist (PR) on the wafer surface through photolithography;

electroplating an electroplating copper solution into the one or more trenches to form the RDL structure, wherein the electroplating copper solution comprises 0.4 M to 0.6 M of $CuSO_4 \cdot 5H_2O$, 70-100 g/L $H_2SO_4$, 30-50 ppm of HCl, the fine grains, the nanotwinned copper, and one or more additives;

removing the PR, the vapor-phase deposited liner and the copper seed layer by etching; and inevitably etching and roughening the top surface of the RDL structure.

13. The method of claim 10, further comprising a step of depositing a second dielectric layer above the RDL structure, followed by repeating the step of forming RDL structure to form other RDL structures in the IC package.

14. The method of claim 12, wherein the one or more additives comprise an accelerator and an inhibitor.

15. The method of claim 14, wherein the accelerator comprises sodium methanesulfonate, propansulfonic acid salts, or a combination thereof.

16. The method of claim 14, wherein the inhibitor comprises polyoxyethylene, poly(p-phenylene oxide), or a combination thereof.

17. The method of claim 12, wherein the vapor-phase deposited liner comprises Ti, TiN, or TaN.

* * * * *